United States Patent
Li et al.

(10) Patent No.: US 11,791,626 B2
(45) Date of Patent: *Oct. 17, 2023

(54) ELECTROSTATIC DISCHARGE CLAMP STRUCTURES

(71) Applicant: GLOBALFOUNDRIES U.S. INC., Malta, NY (US)

(72) Inventors: You Li, South Burlington, VT (US); Alain F. Loiseau, Williston, VT (US); Souvick Mitra, Essex Junction, VT (US); Tsung-Che Tsai, Santa Clara, CA (US); Mickey Yu, Essex Junction, VT (US); Robert J. Gauthier, Jr., Williston, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 133 days.

This patent is subject to a terminal disclaimer.

(21) Appl. No.: 17/490,371

(22) Filed: Sep. 30, 2021

(65) Prior Publication Data
US 2022/0021205 A1    Jan. 20, 2022

Related U.S. Application Data

(63) Continuation of application No. 16/033,731, filed on Jul. 12, 2018, now Pat. No. 11,201,466.

(51) Int. Cl.
*H02H 9/04* (2006.01)
*H01L 27/02* (2006.01)
*H02H 1/00* (2006.01)
*H01L 23/60* (2006.01)

(52) U.S. Cl.
CPC .......... *H02H 9/046* (2013.01); *H01L 23/60* (2013.01); *H01L 27/0255* (2013.01); *H01L 27/0262* (2013.01); *H01L 27/0288* (2013.01); *H01L 27/0292* (2013.01); *H02H 1/0007* (2013.01)

(58) Field of Classification Search
CPC ...... H02H 9/046; H02H 1/0007; H01L 23/60; H01L 27/0255; H01L 27/0262; H01L 27/0288; H01L 27/0292
USPC .......................................................... 361/56
See application file for complete search history.

(56) References Cited

U.S. PATENT DOCUMENTS

| | | |
|---|---|---|
| 3,508,134 A | 4/1970 | Dosch et al. |
| 5,872,379 A | 2/1999 | Lee |
| 5,880,488 A | 3/1999 | Yu |
| 6,765,771 B2 | 7/2004 | Ker et al. |
| 6,770,918 B2 | 8/2004 | Russ et al. |
| 9,780,558 B2 | 10/2017 | Parris et al. |
| 2002/0153571 A1 | 10/2002 | Mergens et al. |

(Continued)

FOREIGN PATENT DOCUMENTS

CN    103001200 A    3/2013

OTHER PUBLICATIONS

Taiwanese Office Action and Search Report in TW related Application No. 11020095310 dated Feb. 1, 2021, 12 pages.

*Primary Examiner* — Dharti H Patel
(74) *Attorney, Agent, or Firm* — Francois Pagette; Andrew M. Calderon; Calderon Safran & Cole P.C.

(57) ABSTRACT

A circuit structure includes: a network of clamps; sense elements in series with the clamps and configured to sense a turn-on of at least one clamp of the network of clamps; and feedback elements connected to the clamps to facilitate triggering of remaining clamps of the network of clamps.

20 Claims, 3 Drawing Sheets

(56) References Cited

U.S. PATENT DOCUMENTS

| | | | |
|---|---|---|---|
| 2004/0021998 A1* | 2/2004 | Salome | H01L 27/0262 |
| | | | 361/56 |
| 2004/0057180 A1 | 3/2004 | Pashmakov | |
| 2004/0057189 A1 | 3/2004 | Cheever, Jr. et al. | |
| 2005/0029540 A1 | 2/2005 | Kodama et al. | |
| 2005/0195546 A1 | 9/2005 | Itoshima et al. | |
| 2005/0212051 A1* | 9/2005 | Jozwiak | H01L 23/62 |
| | | | 257/E29.225 |
| 2005/0231177 A1 | 10/2005 | Tateno et al. | |
| 2007/0002508 A1 | 1/2007 | Vanysacker et al. | |
| 2008/0029820 A1 | 2/2008 | Disney et al. | |
| 2009/0213506 A1 | 8/2009 | Zhan et al. | |
| 2010/0118454 A1* | 5/2010 | Ker | H01L 27/0251 |
| | | | 361/56 |
| 2016/0276460 A1* | 9/2016 | Laine | H01L 21/76283 |

* cited by examiner

ELECTROSTATIC DISCHARGE CLAMP STRUCTURES

FIELD OF THE INVENTION

The present disclosure generally relates to semiconductor structures and, more particularly, to electrostatic discharge clamp structures and methods of manufacture.

BACKGROUND

As semiconductor devices continue to scale downwards, e.g., shrink, the desired spacing between features (i.e., the pitch) also becomes smaller. To this end, in the smaller technology nodes, devices become more vulnerable to external stress. Accordingly, it becomes ever more difficult to fabricate devices with certain features to guarantee a robust chip due to critical dimension (CD) scaling and process capabilities, as well as materials that are used to fabricate such structures.

Electrostatic discharge (ESD) events can cause issues, even for robust chips. For example, an ESD power clamp comprises distributed local clamp networks which are implemented to provide protection from an ESD event. However, during an ESD event, some of the local clamps in the networks may turn on first causing a snapback, i.e., be triggered, while other clamps remain off. More specifically, in a conventional ESD event, a clamp will turn on and a snapback occurs at a certain point as the voltage increases, resulting in a snapback to a lower voltage. This results in a majority of the ESD current to flow only through the triggered local clamps, causing an earlier failure of the device. For example, the snapback will cause a clamping of the ESD voltage below a triggering voltage, thereby causing a breakdown of the oxide material because of the increase in triggering voltage. This requires an extra design area to achieve the same ESD design target.

SUMMARY

In an aspect of the disclosure, a structure comprises: a network of clamps; sense elements in series with the clamps and configured to sense a turn-on of at least one clamp of the network of clamps; and feedback elements connected to the clamps to facilitate triggering of remaining clamps of the network of clamps.

In an aspect of the disclosure, a structure comprises: a network of silicon controlled rectifier (SCR) clamps; a passive element directly connected to at least one SCR clamp; a sensing amplifier directly connected to the passive element; and a triggering circuit connected to the at least one SCR clamp to facilitate triggering of the at least one SCR clamp.

In an aspect of the disclosure, a method comprises: sensing a current difference from a clamp in a network of clamps; and triggering remaining clamps in the network of clamps in response to a lack of current difference.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to electrostatic discharge clamp structures and methods of manufacture. In embodiments, the structures herein include electrostatic discharge (ESD) sense elements and feedback elements connected in series with local clamps. During a triggering of a local clamp, a triggering circuit which includes sense elements and feedback elements will feedback and facilitate the triggering of the remaining clamps in the network. Advantageously, the processes and structures provided herein allow for ESD protection without needing to enlarge each individual clamp.

The multi-triggering of the clamps is achieved by implementing ESD sense elements and a feedback network, amongst other features. In embodiments, the ESD sense elements can include a diode or resistor connected in series with a local clamp and a detection circuit to sense the turn-on of the local clamp. Once the turn-on (triggering) of the local clamp is sensed, the feedback elements facilitate triggering of any remaining local clamps in the network. In further embodiments, the feedback elements can include a triggering circuit. Accordingly, by implementing the circuitry here, all the clamps can be triggered allows for an even distribution of an ESD current across all of the clamps in a network. Specifically, the triggering of all of the clamps allows for every clamp to contribute in shunting the ESD current. In this way, the processes and structures provided herein utilize design space more efficiently since enlarged clamps are not needed to provide adequate ESD protection.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
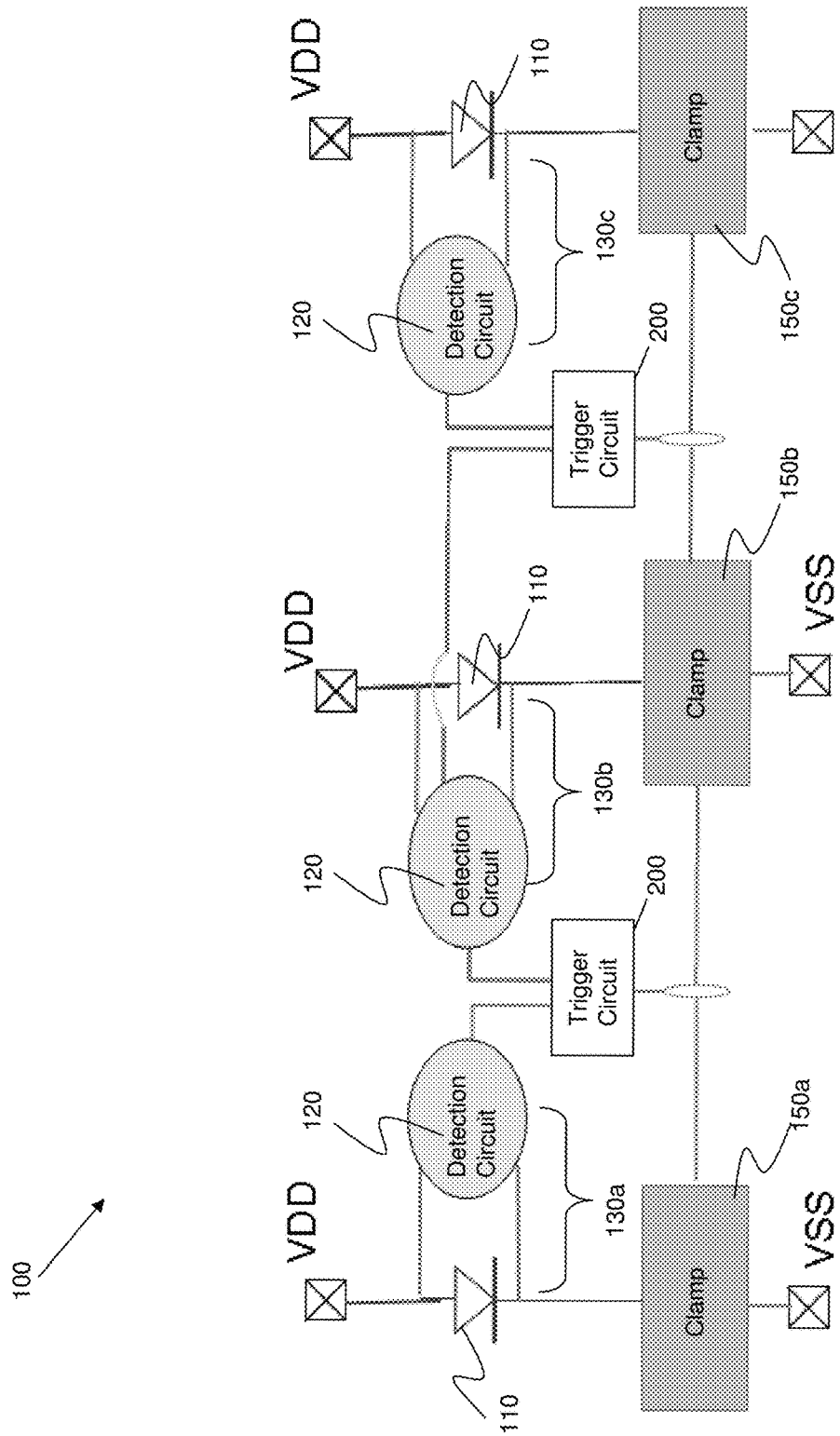
FIG. 1 shows an electrostatic discharge (ESD) protection circuit, amongst other features, and respective fabrication processes in accordance with aspects of the present disclosure.

FIG. 1 shows a circuit and respective fabrication processes in accordance with aspects of the present disclosure. More specifically, FIG. 1 shows a circuit 100 for protection from an electrostatic discharge (ESD) event. The circuit 100 includes supply pins VDD and VSS, in addition to ESD sensing elements 130a, 130b, 130c, which are configured to sense the triggering of a network of clamps, i.e., local clamps 150a, 150b, 150c. Specifically, the sense elements, i.e., ESD sensing elements 130a, 130b, 130c, are in series with the clamps, i.e., local clamps 150a, 150b, 150c, and are configured to sense a turn-on of at least one clamp of the network of clamps, i.e., the local clamps 150a, 150b, 150c.

The ESD sensing elements 130a, 130b, 130c each comprise an element 110 and a detection circuit 120 for sensing the triggering of local clamps 150a, 150b, 150c. In embodiments, the element 110 can be a passive element directly connected to a clamp of the local clamps 150a, 150b, 150c. Particularly, the element 110 can be connected in series with the local clamps 150a, 150b, 150c. In embodiments, the element 110 can be a diode, as illustrated in FIG. 1. In this way, the sense elements, i.e., the ESD sensing elements 130a, 130b, 130c, comprise diodes. In alternative embodiments, the element 110 can be a resistor, amongst other examples of passive elements. Specifically, the sense elements, i.e., the ESD sensing elements 130a, 130b, 130c, can comprise resistors. In this way, the passive element, i.e., element 110, is a diode or a resistor. Further, the detection circuit 120 can be a differential amplifier, amongst other sensing amplifiers. Specifically, the sensing amplifier is a differential amplifier. In this way, the sense elements, i.e., the ESD sensing elements 130a, 130b, 130c, comprise a differential amplifier.

Still referring to FIG. 1, the local clamps 150a, 150b, 150c can be silicon controlled rectifier (SCR) clamps configured to prevent the breakdown of circuitry. In this way, the local clamps 150a, 150b, 150c are a network of silicon controlled rectifier (SCR) clamps. Further, a passive element, i.e., element 110, is directly connected to at least one SCR clamp of the local clamps 150a, 150b, 150c. In even further embodiments, a sensing amplifier, i.e., the detection circuit 120, is directly connected to the passive element, i.e., element 110.

During an ESD event, an ESD current turns ON, i.e., triggers, at least one of the local clamps 150a, 150b, 150c by flowing into one or more clamps of the local clamps 150a, 150b, 150c. Triggering of a single clamp, though, can result in a snapback and clamping of the ESD voltage below a triggering voltage, in an attempt to minimize a voltage drop. To avoid such issues, the circuitry described herein prevents the occurrence of the ESD current going through only a small number of triggered clamps, while the remaining clamps remain OFF.

More specifically, to provide complete protection from the ESD event, circuit 100 is configured to turn ON all of the local clamps 150a, 150b, 150c during an ESD event in order to evenly distribute the ESD current amongst all of the local clamps 150a, 150b, 150c. In this way, the ESD current will be distributed across all clamps, thereby eliminating the need for large clamps since all the clamps are now utilized during the ESD event. Accordingly, by implementing the circuitry herein, the size of the local clamps 150a, 150b, 150c can be reduced, e.g., from 3.5 amps down to 0.6 amps, for example. In this way, each clamp is 0.6 amps.

In operation, the ESD sensing elements 130a, 130b, 130c are configured to sense the triggering of any of the local clamps 150a, 150b, 150c during an ESD event. As an example, a diode, i.e., element 110, is turned ON when the local clamp 150a is triggered, i.e., turned ON. The detection circuit 120 senses that the local clamp 150a is triggered by sensing a current difference between the element 110 and the local clamp 150a when the local clamp 150a is triggered. In this way, a current difference between the diode or the resistor, i.e., element 110, and at least one SCR clamp, i.e., the local clamp 150a, is sensed by the (sensing) differential amplifier, i.e., the detection circuit 120. Particularly, there is a sensing of a current difference between a clamp in a network of clamps and a passive element. This current difference results in a determination that an ESD event is occurring. This same process can occur for each of the remaining ESD sensing elements 130b, 130c. For example, when the ESD sensing elements 130b, 130c sense that their respective elements 110 are OFF, the detection circuits 120 sense that the remaining local clamps 150b, 150c are OFF because no current difference exists between the elements 110 of the remaining ESD sensing elements 130b, 130c and the remaining clamps 150b, 150c.

To prevent the ESD event from breaking down the circuitry (e.g., due to all of the local clamps 150a, 150b, 150c not being ON), a feedback element 200 triggers any remaining clamps which are turned OFF, by injecting currents into these clamps. In embodiments, the feedback elements 200 comprise a triggering circuit to trigger any of the OFF clamps of the local clamps 150a, 150b, 150c. In this way, a triggering circuit is connected to at least one SCR clamp to facilitate triggering of the at least one SCR clamp. More specifically, the triggering circuit can feedback and facilitate the triggering of any of the OFF clamps which have not been triggered. For example, after the ESD sensing elements 130b, 130c sense that the local clamps 150b, 150c are not triggered, the feedback elements 200 will send a current into the local clamps 150b, 150c. More specifically, there is a triggering of remaining clamps, i.e., local clamps 150b, 150c, in the network of clamps, i.e., the local clamps 150a, 150b, 150c, in response to a lack of current difference between the remaining clamps and remaining passive elements, i.e., elements 110 of the ESD sensing elements 130b, 130c.

The triggering of the remaining clamps 150b, 150c comprises injecting the remaining clamps with a triggering current from a triggering circuit. In this way, all of the local clamps 150a, 150b, 150c in the network can now be triggered and can assist in shunting the ESD current. Specifically, the feedback elements 200 are connected to the clamps, i.e., the local clamps 150a, 150b, 150c, to facilitate triggering of remaining clamps of the network of clamps, i.e., the local clamps 150a, 150b, 150c.

Figure 2:
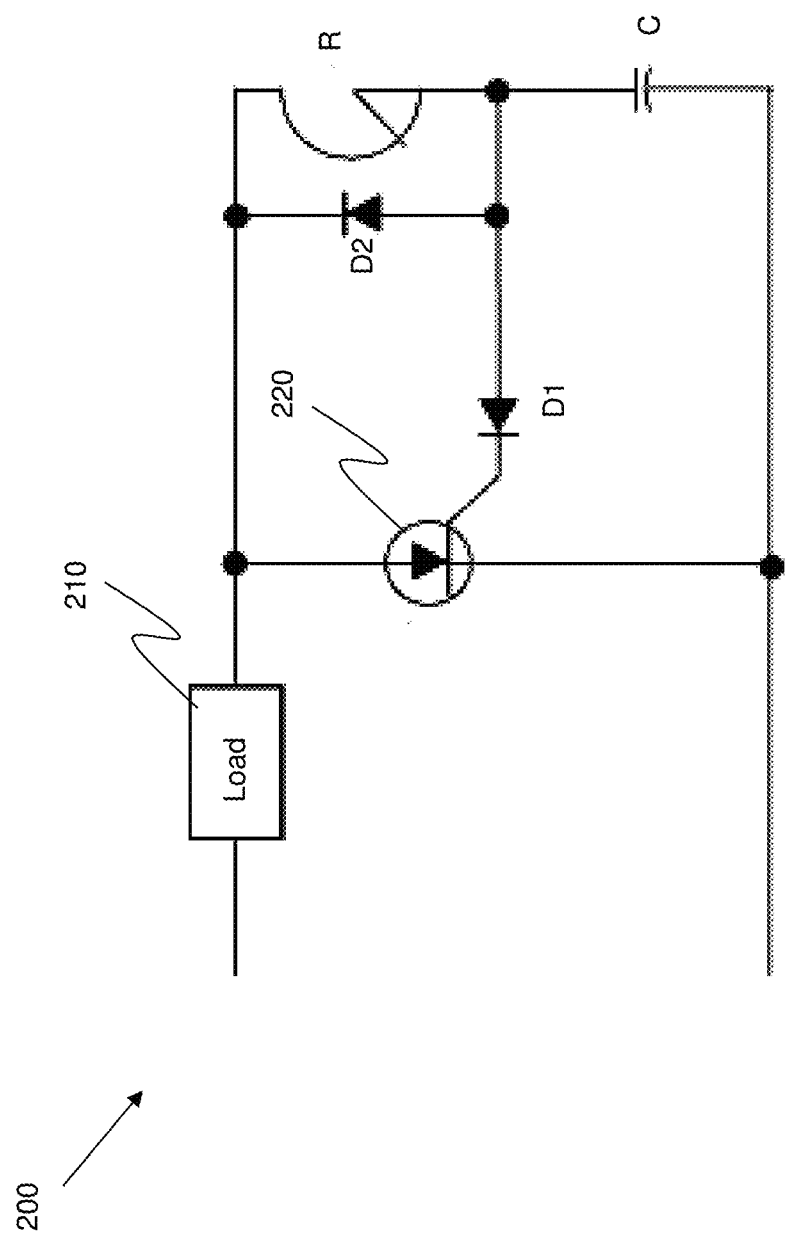
FIG. 2 shows a triggering circuit, amongst other features, and respective fabrication processes in accordance with additional aspects of the present disclosure.

FIG. 2 illustrates a feedback element 200 in accordance with aspects of the present disclosure. In embodiments, the feedback element 200 comprises a resistor-capacitor (RC) triggering circuit for triggering any of the OFF clamps. In this way, the triggering circuit is a resistor-capacitor (RC) triggering circuit. The RC triggering circuit includes a load 210, a variable resistor R, diodes D1 and D2, a silicon controlled rectifier (SCR) 220, which is part of the local clamps 150a, 150b, 150c, and a capacitor C. In embodiments, power to the load 210 is controlled by the SCR 220. For a positive cycle, the capacitor C charges to a trigger point of the SCR 220 in a time determined by an RC time constant and a rising anode voltage. Further, varying the resistance through the variable resistor R controls a triggering or firing angle of an input signal.

For a negative half cycle, the capacitor C charges in a reverse direction when a supply voltage increases towards a positive side and a capacitor voltage of the capacitor C recharges in an opposite direction. When the capacitor voltage reaches a threshold voltage, the SCR 220 will turn ON and the capacitor C will discharge through diode D2. Diode D1 prevents the negative voltage between a gate and a cathode during the negative half cycle. Activation of the SCR 220 will cause the local clamps 150a, 150b, 150c to be triggered, i.e., turned ON. In further embodiments, other triggering circuits are contemplated which can inject a current into the local clamps 150a, 150b, 150c.

Figure 3:
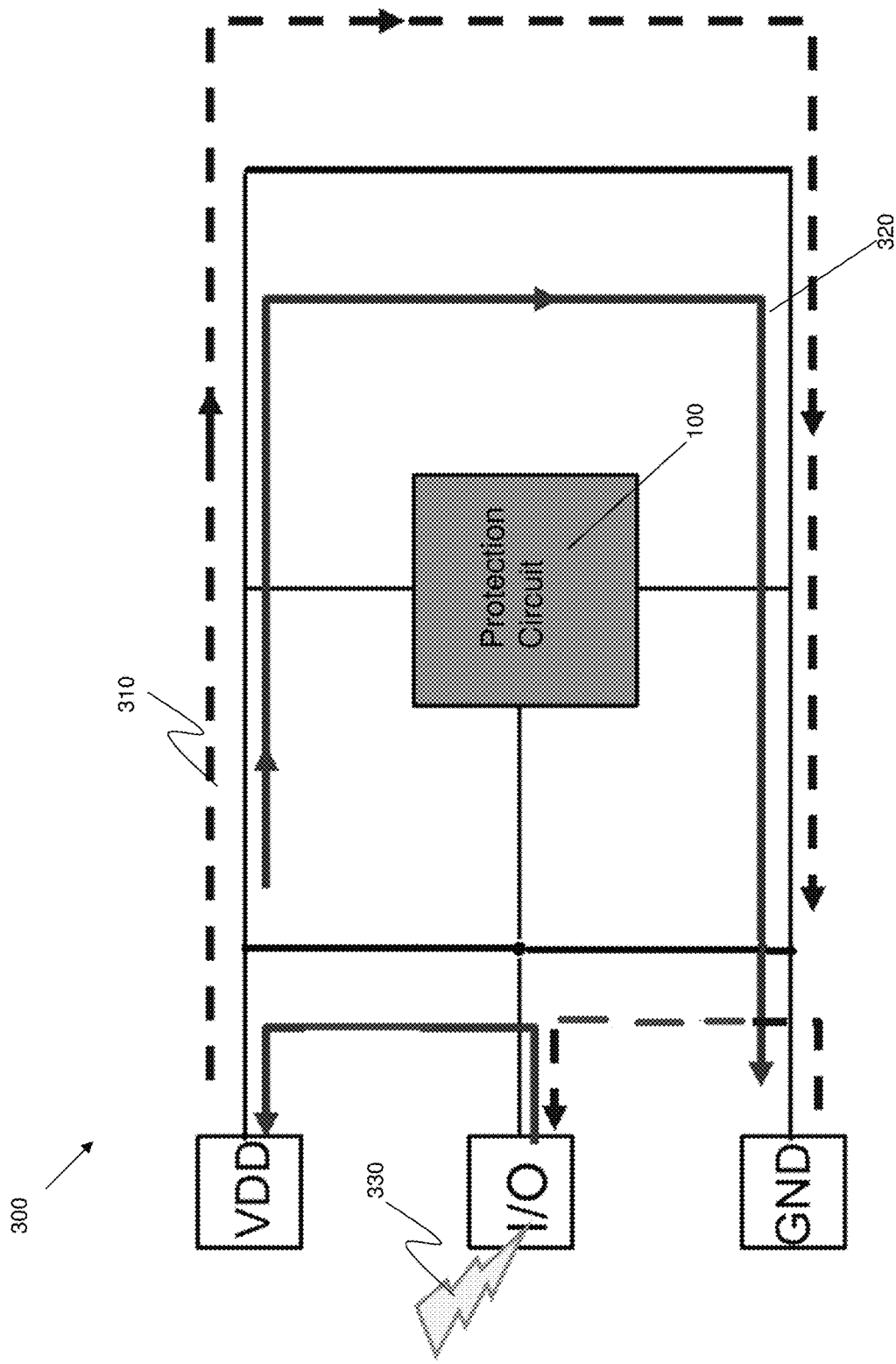
FIG. 3 shows an implementation of the ESD protection circuit, amongst other features, and respective fabrication processes in accordance with additional aspects of the present disclosure.

FIG. 3 shows a schematic diagram 300 which implements the circuit 100 of FIG. 1. In a non-limiting illustrative example, the schematic diagram 300 can meet industry ESD requirements, e.g., 2000V HBM, 250V CDM. By way of example, a negative pulse 310 flows from supply VDD to ground GND. Further, a positive pulse 320 flows between VDD and the input/output (I/O) and also into GND. In the event that an ESD current 330 enters the I/O, the circuit 100 is able to provide ESD protection by triggering all of the local clamps for even distribution of the ESD current. In this way, the circuit 100 provides power pin ESD protection between VDD and GND, and also provides I/O pin ESD protection between VDD and I/O and I/O and GND.

It should now be understood that the processes and resultant structures described herein will allow devices to be protected from electrostatic discharge (ESD) events by evenly distributing the ESD current across all clamps. The distribution of the ESD current across all clamps is achieved by activating any remaining clamps which were not activated by the ESD current. In embodiments, ESD elements in series with each clamp sense the activation of the clamps. Once an ESD event is determined, the remaining clamps will be turned on by a feedback element. In this way, design space is utilized more efficiently because there is no need to enlarge a clamp, since all clamps contribute to shunting the ESD current.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A circuit structure, comprising:
   a network of clamps;
   sense elements each respectively connected in series with a corresponding one of the clamps of the network of clamps; and
   feedback elements each having an input connected to receive an input from at least one of the sense elements and each having an output connected to at least one of the clamps,
   wherein the feedback elements each comprise a triggering circuit, the triggering circuit comprises a first input connected to an output of one of the sense elements, a second input connected to an output of an adjacent one of the sense elements and an output connected to at least two of the clamps.

2. The circuit structure of claim 1, wherein the clamps are silicon controlled rectifier (SCR) clamps.

3. The circuit structure of claim 1, wherein the sense elements comprise diodes.

4. The circuit structure of claim 1, wherein the sense elements comprise resistors.

5. The circuit structure of claim 1, wherein the sense elements comprise a differential amplifier.

6. The circuit structure of claim 1, wherein the triggering circuit is a resistor-capacitor (RC) triggering circuit.

7. The circuit structure of claim 6, wherein each clamp is 0.6 amps, and the RC triggering circuit includes a resistor coupled in series with a capacitor, a first diode coupled in parallel with the resistor, a silicon controlled rectifier (SCR) coupled in parallel with the resistor and the first diode, and a second diode coupled between a node connecting the resistor and the first diode and a control terminal of the SCR.

8. The circuit structure of claim 1, wherein the sense elements comprise one of a diode and a resistor connected in series with the corresponding one of the clamps and a detection circuit to sense a turn-on of the corresponding one of the clamps.

9. The circuit structure of claim 8, further comprising a passive element directly connected to at least one of the clamps and a sensing amplifier.

10. A circuit structure, comprising:
    a network of silicon controlled rectifier (SCR) clamps;
    a passive element connected to at least one SCR clamp;
    a sensing amplifier connected to the passive element; and
    a triggering circuit comprising a first input connected to an output of the sensing amplifier, a second input connected to an output of another sensing amplifier adjacent to the sensing amplifier, and an output connected to the at least one SCR clamp and to at least one other SCR clamp.

11. The circuit structure of claim 10, wherein the passive element is a diode or a resistor.

12. The circuit structure of claim 11, wherein the sensing amplifier is a differential amplifier.

13. The circuit structure of claim 12, wherein a current difference between the diode or the resistor and the at least one SCR clamp is sensed by the differential amplifier.

14. The circuit structure of claim 10, wherein the triggering circuit is a resistor-capacitor (RC) triggering circuit, and the RC triggering circuit includes a resistor coupled in series with a capacitor, a first diode coupled in parallel with the resistor, an SCR element coupled in parallel with the resistor and the first diode, and a second diode coupled between a node connecting the resistor and the first diode and a control terminal of the SCR element.

15. A method, comprising:
    sensing a current difference, via a sensing amplifier, between a clamp in a network of clamps and a passive element connected to the clamp; and
    triggering remaining clamps in the network of clamps in response to sensing the current difference between the clamp and the passive element connected to the clamp,
    wherein the triggering is performed by a triggering circuit comprising a first input connected to an output of the sensing amplifier, a second input connected to an output of another sensing amplifier adjacent to the sensing amplifier, and an output connected to the clamp and to at least one other clamp of the network of clamps.

16. The method of claim 15, wherein the sensing amplifier is a differential amplifier.

17. The method of claim 15, wherein the passive element is a diode.

18. The method of claim 15, wherein the passive element is a resistor.

19. The method of claim 15, wherein the triggering the remaining clamps comprises injecting the remaining clamps with a triggering current from the triggering circuit.

20. The method of claim 15, wherein the triggering circuit is a resistor-capacitor (RC) triggering circuit, and wherein the RC triggering circuit includes a resistor coupled in series with a capacitor, a first diode coupled in parallel with the resistor, an SCR coupled in parallel with the resistor and the first diode, and a second diode coupled between a node connecting the resistor and the first diode and a control terminal of the SCR.

\* \* \* \* \*